US008839160B2

(12) United States Patent
Castro-Pareja et al.

(10) Patent No.: US 8,839,160 B2
(45) Date of Patent: Sep. 16, 2014

(54) MASKS FOR DOUBLE PATTERNING PHOTOLITHOGRAPHY (75) Inventors: Carlos R. Castro-Pareja, Aloha, OR (US); Allan Xiao Yu Gu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,630

(22) PCT Filed: Dec. 29, 2011

(86) PCT No.: PCT/US2011/067894
§ 371 (c)(1),
(2), (4) Date: Jun. 28, 2013

(87) PCT Pub. No.: WO2013/101090
PCT Pub. Date: Jul. 4, 2013

(65) Prior Publication Data
US 2014/0047398 A1    Feb. 13, 2014

(51) Int. Cl.
*G06F 17/50*      (2006.01)
*G03F 1/68*       (2012.01)
(52) U.S. Cl.
CPC . *G06F 17/50* (2013.01); *G03F 1/68* (2013.01)
USPC .......................................................... 716/55

(58) Field of Classification Search
USPC ............................................................ 716/55
See application file for complete search history.

(56) References Cited

U.S. PATENT DOCUMENTS

| 7,802,226 | B2  |   | 9/2010 | Park et al.                      |
|-----------|-----|---|--------|----------------------------------|
| 7,913,197 | B1  | * | 3/2011 | Kruger et al. ............. 716/53 |
| 8,402,396 | B2  | * | 3/2013 | Kahng et al. .............. 716/52 |
| 2011/0003254 | A1 |  | 1/2011 | Chang et al.                     |
| 2011/0078638 | A1 | * | 3/2011 | Kahng et al. .............. 716/52 |
| 2013/0061183 | A1 | * | 3/2013 | Abou Ghaida et al. ...... 716/52 |

OTHER PUBLICATIONS

PCT Search Report, PCT/US2011/067894, Intel Corporation, Dec. 29, 2011, 8 pages.

* cited by examiner

*Primary Examiner* — Vuthe Siek
*Assistant Examiner* — Mohammed Alam
(74) *Attorney, Agent, or Firm* — Blakely, Sokoloff, Taylor & Zafman LLP (57) ABSTRACT

Improved masks for double patterning lithography are described. In one example, conflict spaces between features of a target design are identified. The conflict spaces are represented as nodes of a graph. Connections are inserted between nodes based on a local search. The connections are cut to determine double patterning mask assignment. The connections are extended to form a checkerboard that is then overlayed on the target mask design to split the features of the target mask design for double patterning.

19 Claims, 6 Drawing Sheets

MASKS FOR DOUBLE PATTERNING PHOTOLITHOGRAPHY

CROSS-REFERENCE TO RELATED APPLICATION

This patent application is a U.S. National Phase Application under 35 U.S.C. §371 of International Application No. PCT/US2011/067894, filed Dec. 29, 2011, entitled "IMPROVED MASKS FOR DOUBLE PATTERNING PHOTOLITHOGRAPHY".

TECHNICAL FIELD

The present description relates to the field of mask pattern layout for photolithography and, in particular, to improving the division of features between double patterning masks.

BACKGROUND

Electronic and micromechanical devices are formed by patterning successive layers on a substrate using lithography. The patterns are formed by applying a layer of photoresist to a surface. Light is then passed through a patterned imaging plate, such as a mask or reticle, to expose the photoresist in patterns that correspond to the desired features on the substrate. A developer is applied and the photoresist is etched away leaving only the features in a pattern corresponding to the pattern on the mask. As the size of the features, such as parts of transistors, decreases, there are more features on the same size mask and the mask designs becomes more complex.

For very small features, phase shift technology (referred to as phase shift masks) is used. In a conventional non-phase shift mask, the light transmitted through adjacent transparent areas of the mask is in phase and the features are large enough that the phase of the light does not significantly affect the amount of light that hits the photoresist. Each transparent area on the mask results in a corresponding exposed area on the photoresist. With very small features, that is when the dimensions of the features are close to the wavelength of the light, diffraction occurs as the light passes through the mask. The light passing through adjacent transparent areas will interfere constructively or destructively, so that in some places on the photoresist the amplitude of the light adds together and on some places of the photoresist that light will cancel itself out.

Pitch doubling is a double patterning technique where the target layout is partitioned into two masks. The masks are used one at a time to expose the photoresist in two steps. Together the two masks reproduce the design intent. Using two masks allows features that are too close together to be produced by a single mask to be produced each by a different mask. As a result, still smaller features may be produced.

For simple grating patterns, the problem of synthesizing two masks from a target pattern can be seen as a 2-color graph coloring problem where the graph nodes are the target polygons and edges represent polygon adjacency.

However, for random polygon layouts the 2-graph coloring method quickly runs into coloring conflicts that require partitioning the polygons to mitigate the conflicts. The partitioning is then difficult to predict and to calculate. Poor partitioning can impact manufacturing yield and reduce parts quality. One reason is that when polygons are split errors can be caused by features that both masks produce. The exposure from one mask may not perfectly overlay the exposure from the next mask. This can be overcome using stringent design rules that guarantee no conflicts in the formulation of the masks and the splitting of features. However, strict rules reduce the design space and cause a loss of flexibility in design.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Masks for pitch doubling double patterning processes are synthesized. A target layout is mapped into a checker board that is warped to optimize the split between the double masks for manufacturability. A topological graph may also be used to simplify the final geometry. The topological graph may be used to reduce overlay errors and improve mask uniformity.

Figure 1:
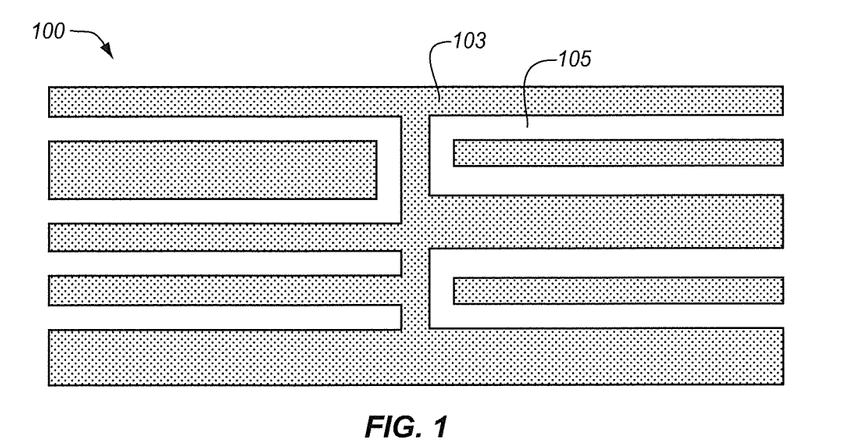
FIG. 1 is diagram of a portion of target design for a photolithography mask.

Referring to FIG. 1, a target design 100 is shown for a photolithography mask. The design is represented on a single mask and elements must be divided between two masks for a double patterning process. The target design has features 103 indicated by stippling and spaces between the features 105 indicated as clear. The target design is shown as an example only; embodiments of the invention may be applied to any of a number of different target designs.

Figure 2:
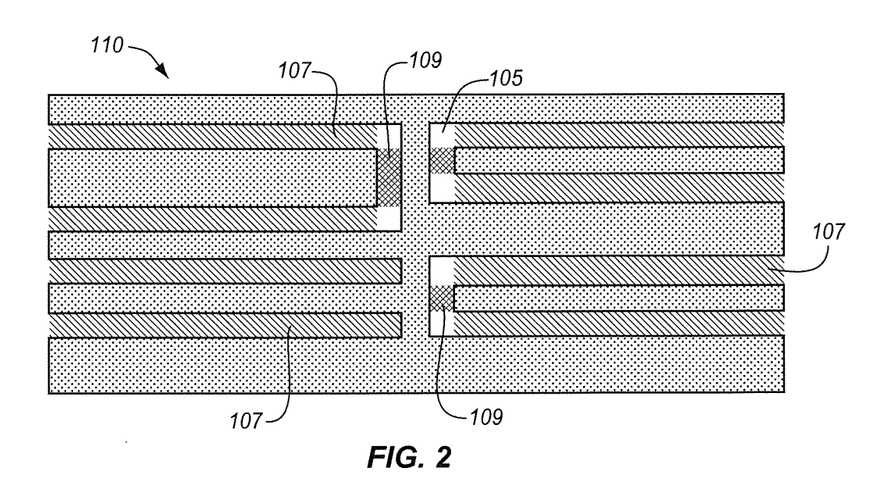
FIG. 2 is diagram of the mask of FIG. 1 with critical spaces identified according to an embodiment of the invention.
Figure 3:
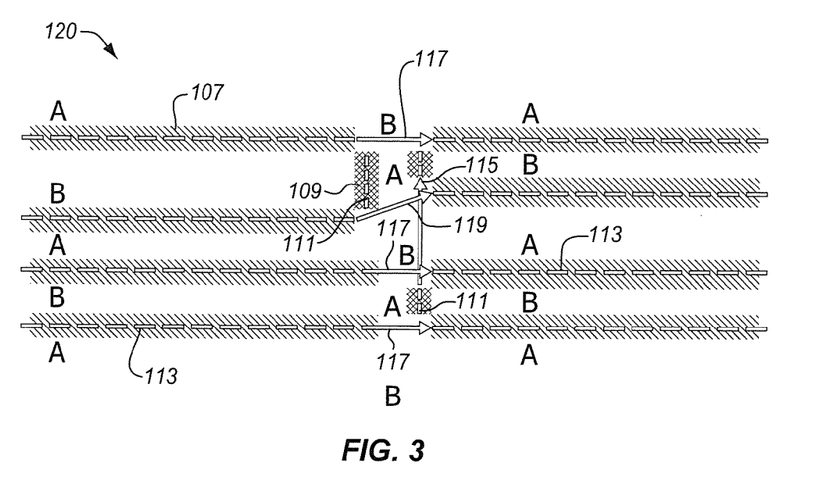
FIG. 3 is diagram of the medial axes of the critical spaces of the mask of FIG. 1 applied to a graph according to an embodiment of the invention.

For the design of FIG. 1, the spaces between the features are too narrow to be printed accurately with a single mask. The pitch (smallest critical dimension for the process) may be doubled by using two masks for double patterning. The first step identifies conflict regions using process constraints as shown in FIG. 2. The same target design 110 is enhanced by indicating the critical spaces in the target design that cannot be produced using a single mask. Two types of critical spaces are shown: horizontal 107 and vertical 109 (corner to corner critical spaces may also be supported). A graph based splitting algorithm may be used to capture critical spaces in the design geometry. The critical areas may be determined in any of a variety of different ways, such as Boolean sizing, polygon-based searches, scanline algorithms, etc. These areas will later be used to form the backbone of a checkerboard as shown in FIG. 3.

In the present example, the critical spaces are spaces in which features are too close to each other to be printed using a single mask. This limitation occurs when the wavelength of the light used to illuminate the photoresist is too large in comparison to the pitch of the features being printed. The pitch is related to the width of a feature plus the distance from that feature to the next feature. For small pitch masks, the light may be diffracted when passing through the very narrow slits in the mask and does not produce the intended features. In some cases, even smaller features can be created by taking advantage of the diffraction using a phase shift mask. A phase shift mask creates interference patterns in the light that passes through it. The interference patterns cause constructive and destructive interference in the light as it hits the photoresist, however, phase shift masks are also limited in the smallest feature that can be printed on photoresist. Embodiments of the present invention may be applied to phase shift and conventional masks to improve double patterning mask designs.

While the critical areas in the present example are based on the smallest critical dimension, critical areas may also be identified that correspond to other limitations of the photolithography process that will be applied to the mask. Some additional constraints include vertical distance, horizontal distance, and corner to corner distance. The constraints may also be related to the overlay capability of the steppers, or to other processing steps. Other constraints may be identified, depending on the photolithography process being used.

In the illustrated example, the design features have only horizontal and vertical dimensions, i.e. there are no round or curved features. Accordingly, the critical areas can be separated into horizontal and vertical and these can be applied to create a checkerboard effect on a graph. FIG. 2 is an example of how to represent the constraints as graphs, where each critical area is assigned to a graph node. In other types of masks, there may be other shapes and other directions and the techniques described here may be adapted accordingly.

In FIG. 3, conflict areas 107, 109 are isolated onto a graph and the medial axes of the conflict areas are found and indicated using dotted lines. The lines are horizontal 113 for the horizontal conflicts 107 and vertical 111 for the vertical conflicts 109. The dotted lines create a horizontal and vertical pattern that can be used to render a checkerboard type of pattern. The dotted lines are connected using local searches between constraints of the same type. Starting at a horizontal dotted line, a local search is conducted to find nearby horizontal dotted lines that can be connected to the initial one. A nearby horizontal conflict area is then connected in FIG. 3 using an arrow 117. The arrow indicates the direction of the local search, however, the search may be conducted in the opposite direction and the process may start with any one of the critical spaces and sweep through the critical spaces in any desired pattern. Similarly, vertical features 111 are also connected by an arrow 115.

The arrows allow the graph of FIG. 3 to be extended to create lines that may be used to form the backbone of a checkerboard. As shown, most of the critical spaces are aligned and the arrows remain on the horizontal and vertical axes of the graph. However, not all of the critical areas are aligned and there is one arrow 119 that is oriented at an angle from the horizontal. While not shown in the present example, there may be additional arrows that diverge from the horizontal or the vertical axes to different degrees depending upon the particular configuration of the original target design. The local searches may be iterated in order to find the best match for each critical area.

In the local search, the angle by which the system diverges from the horizontal or vertical may be limited. The maximum allowable angle may be determined based on process limitations on corner interactions. Allowing some amount of angular divergence allows for more of the critical areas to be linked for the checkerboard, however, it also allows for features to be connected that may not be suitably close for the limitations of the photolithography process.

The lines of the graph may then be extended to create the checkerboard pattern mentioned above. In the illustrated example, the lines are all either horizontal or vertical and so the lines are extended only in horizontal and vertical directions.

The graph with the arrows creates a warped checker board that can be used to split the design layout into the two groups that will form the final masks. In the example of FIG. 3, each contiguous section of the graph is assigned to either Mask A or Mask B. The top left corner is assigned to Mask A while the top center section is assigned to Mask B. The top left corner is assigned again to Mask A. As shown the areas between the dotted lines and the arrows are assigned in an alternating pattern to the respective masks. As a result, the critical areas adjacent to any one critical area are assigned to the other mask. While, the example pattern of FIG. 1 allows for perfectly alternating division of the features to the masks, this may not be possible with more complex or larger designs. A heuristic, minimum spanning forest and min cut techniques may be used to split the features between the two masks.

Figure 4:
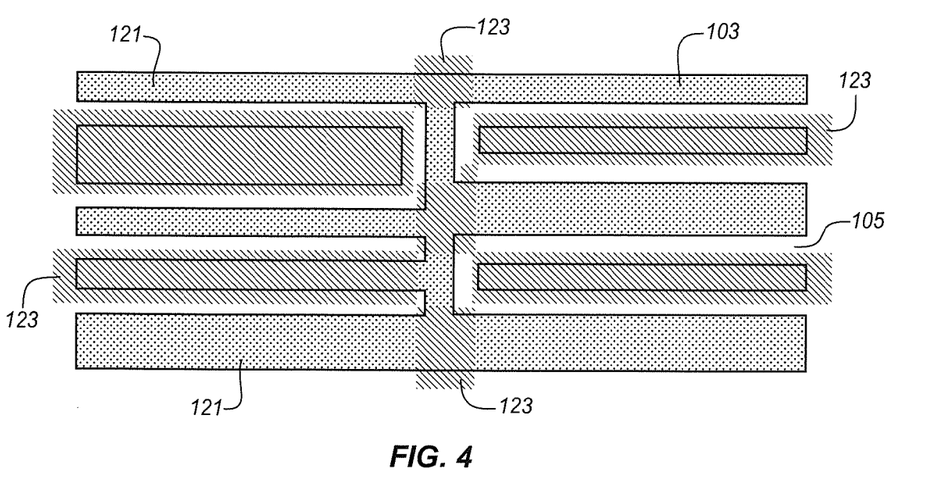
FIG. 4 is diagram of the graph of FIG. 3 overlayed onto the target design showing double patterning feature division according to an embodiment of the invention.

The warped checkerboard may then be applied to overlay the design geometry as shown in FIG. 4. This overlay may then be used to partition the original target design into two groups. One group is assigned to Mask A and the other group is assigned to Mask B. These may then be the final masks to be used in the photolithography process. The masks may also be further optimized as described in more detail below. While the examples identify one mask as A and the other as B, the ordering of the masks may be reversed, depending on the particular implementation. The checkerboard pattern of FIG. 3 provides a convenient guide to overlay on the design geometry. It directly partitions the layout into the two sets.

FIG. 4 shows the original design features 103 and spaces 105 between the design features. It also shows the division of the features into two masks. One set of features is indicated with stippling. This is the part indicated as Mask A in FIG. 3. The other features are marked with shading. This is the part of the checkerboard indicated as Mask B in FIG. 3.

Figure 5:
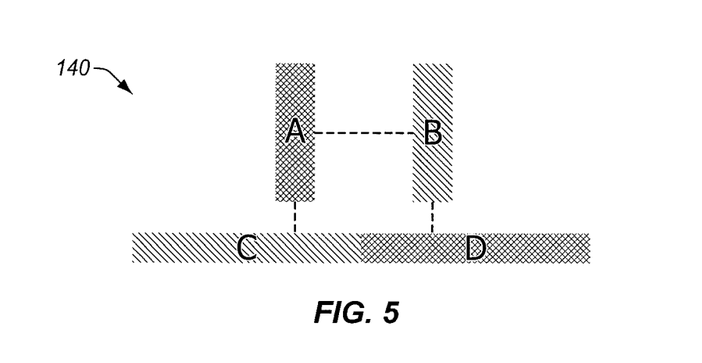
FIG. 5 is diagram of a portion of a second target design for a photolithography mask.

In more complex target designs, it may be more difficult to assign areas to the two masks. FIG. 5 shows a different target design pattern. Again, this target design is greatly simplified to aid in understanding. A real mask design may have many more and more complex features. The mask design has three features, A, B and C-D. A and B are vertical features while C-D is a horizontal feature. There are critical areas between these features indicated by dotted lines. These features need to be assigned to different masks in order to enable double patterning.

As shown, the features are assigned based on the shading. The first mask will print the features shown by diagonal shading and the second mask will print the features shown by cross-hatching. The horizontal feature C-D has been broken in half in order to allow all of the critical areas to be divided between different masks. Since A and B are too close together, they must be assigned to different masks. However A and B are also too close to C-D. Since there are only two masks, in order for C-D to be printed on a different mask from A and also from B, C-D must be broken in half and one part printed with one mask while the other part is printed with the other mask. While this avoids errors in the critical areas, it can result in discontinuities in the horizontal C-D feature.

Figure 6:
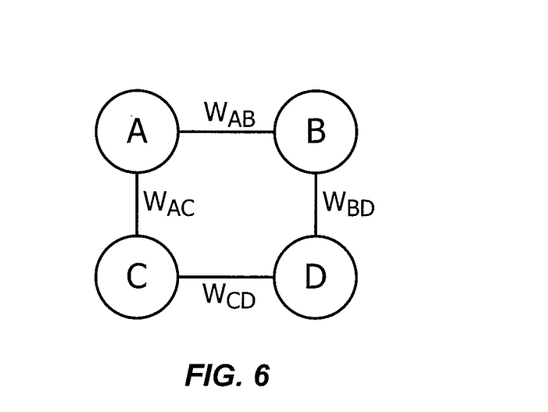
FIG. 6 is diagram of the features of the mask design of FIG. 5 represented as nodes and weighted connections according to an embodiment of the invention.
Figure 7:
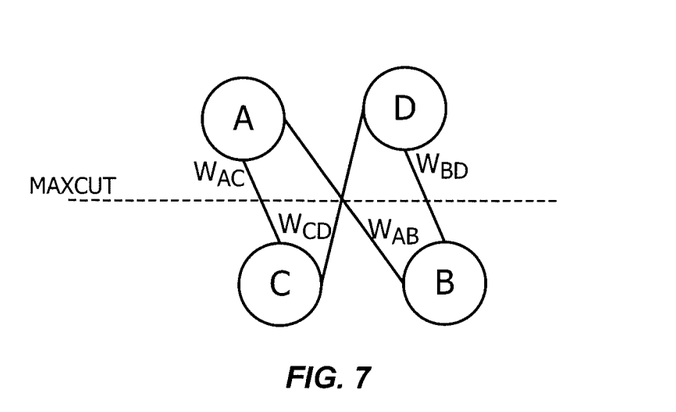
FIG. 7 is diagram of the nodes and weights of FIG. 6 folded to cut through all of the connections according to an embodiment of the invention.

A splitting technique that may be used to obtain the patterning results of FIG. 4 is described in more detail in the context of a different simplified design as shown in FIGS. 5, 6, and 7. A modified version of a min-cut algorithm from graph theory may be used to perform the assignment of features to the two masks. The result of FIG. 5 may be obtained by representing the topology of the split geometry as a two color graph where the nodes A, B, C, D of the graph are the polygons of the two masks and the edges of the graph capture physical connectivity information, critical space information (from the checkerboard algorithm) and neighbor information. The technique finds 'cut-lines,' such as those shown by dotted line in FIG. 3, such that the cost of the edges intersecting that cut line is maximized.

In FIG. 5, each node A, B, C, D is connected to each other node by a cost factor or weight. A and B are connected by a weight $W_{AB}$, B and D are connected by a weight $W_{BD}$, D and C are connected by a weight $W_{DC}$ and C and A are connected by a weight $W_{CA}$. The other connections A-D, C-B do not show a weight because the cost factor between these nodes is zero. The cost functions are based on establishing the critical areas as shown in FIG. 2. In the example of FIG. 2 all of the costs for critical areas were treated as being equal. Similarly, all of the weights of FIG. 6 may be equal. In such an implementation each node is connected to each other node by a cost that is either 0 for no cost or 1 for some cost. The 0 cost weights may then be ignored in a modified min-cut algorithm.

Alternatively, different amounts of cost may be associated with different critical areas so that the weights of FIG. 6 may be different. Very low costs may be given less priority than very high costs. The result will then attempt to put a cut line across all the high costs first and then accommodate the lower costs. The differing amounts for the costs or weights may be determined based on process parameters. As an example, critical areas between longer features would have a higher cost than critical areas between shorter features. Critical areas between thicker features would have a higher cost than critical areas between thinner features. Additional factors based on other process parameters may be used to characterize corner, neighbor, size of critical features, local pattern density and other factors.

FIG. 7 shows the positions of the nodes being folded in the graph so that the cut line, MAXCUT, cuts through each weight and does not cut between any nodes where there is no weight. As a result, the cut line separates A from C and B and D from C and B. On the other hand, it does not cut between A and D where the cost is zero or between C and B where the cost is zero. The graph of FIG. 7 shows that A and D will be assigned to one mask, Mask A as stated in the context of FIG. 5, however, the assignments may be reversed. Features or nodes C and B are assigned to Mask B.

Figure 8:
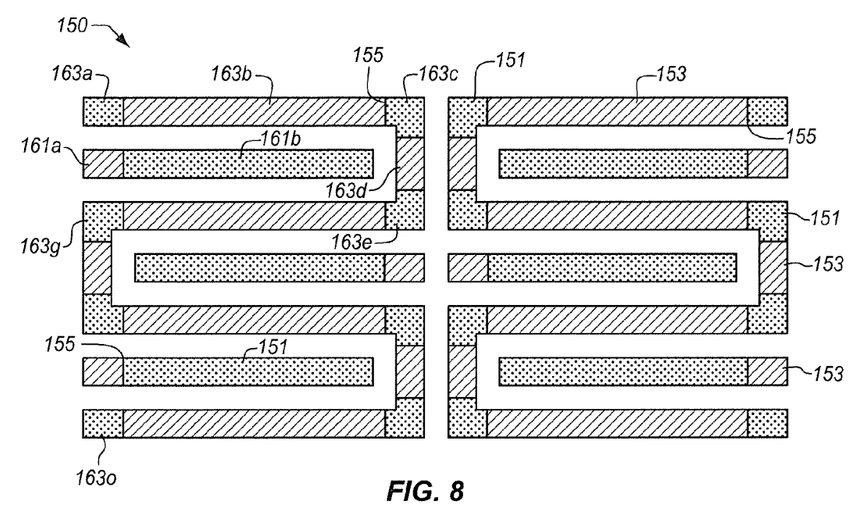
FIG. 8 is diagram of a portion of third target design for a photolithography mask showing double patterning feature division according to an embodiment of the invention.
Figure 9:
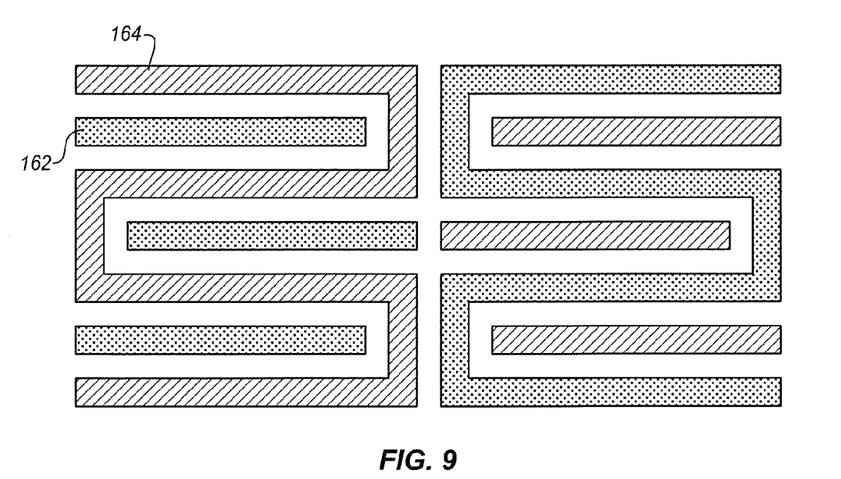
FIG. 9 is a diagram of the mask of FIG. 8 after a simplification of the feature division according to an embodiment of the invention.

Having completed the assignments as shown in FIGS. 4 and 7, the assignments may be further optimized. FIGS. 8 and 9 show an example of representing the output of the checkerboard in a graph that may then be used to reduce polygon splits. A graph based algorithm may be used to further optimize the output to reduce overlay errors. Each overlay in a double patterning process means that a single feature will be formed using two different masks. Because the two masks and the rest of the photolithography equipment will not be perfectly aligned for the two exposures, the feature will have some discontinuity in its final shape after the photolithography is completed. In addition, because the process for the two masks will vary in temperature, exposure level, contamination, etc. the nature of the material will also vary. These discontinuities in the single feature may affect the operation of the eventual circuit.

In FIG. 8 a mask pattern layout 150 has been defined which has features that have been assigned to one of two masks. The target mask design for FIG. 8 is different from that for FIGS. 1 and 5. Features 151 to be exposed with the first mask are shaded while features 153 to be exposed with the second mask are stippled. While the separation of features into two masks will result in all of the critical areas being accurately produced, there are many transitions 155 from one mask to another within a single feature. In other words, a single feature has many partitions in the illustrated example.

A graph node reduction technique may be applied to reduce the number of nodes using the following two lemmas:

Lemma 1: If a polygon in one of the masks does not touch a critical space, then it can be assigned to the other mask.

Lemma 2: If the boundary of a connected group of splitting regions does not touch a critical space, then the splits along such boundary can be removed.

This technique may be used to dramatically reduce the partitions of single features. Reducing these partitions reduces overlay errors and results in higher performance circuits or micro machines. Such results are shown in the example of FIG. 9 which shows the same target design with a different separation of features. In FIG. 8, single features are separated to print on both masks. As an example, a horizontal feature of FIG. 8 is separated into two parts 161a, 161b to print using both of the two masks. The corresponding feature 162 in FIG. 9 is printed on one mask. Similarly, another feature of FIG. 8 is separated into 15 parts 163a to 163o. In FIG. 9, the corresponding feature 164 is printed all using the second mask. This change provides a significant increase in yield, performance and quality in printing using the splitting of FIG. 9 instead of that of FIG. 8.

Referring again to FIG. 8, the application of the two lemmas above is illustrated. The feature represented by portions 161a and 161b correspond to a single feature in the target design and a single polygon. However, with the splitting between the two masks, there are two polygons 161a and 161b. The split has likely been made by considering conflicts as horizontal and vertical lines. 161a is vertically aligned with a similar section 163a of the feature above it and 163g of a feature below it.

According to Lemma 1, since 163c does not touch a critical space it can be assigned to the other mask, as shown in FIG. 9. According to Lemma 2, there exists a connected group of splitting regions (including 163a, 161a and 163g), whose boundary does not touch a critical space. Therefore the mask assignments for 163a, 161a and 163g can be flipped as shown on FIG. 9.

As used herein, a polygon is a feature on a mask surrounded by clear space, i.e. a part of the mask that does not have a feature. Lemma 1 applies to a given polygon if none of its vertical edges touch a vertical critical space and none of its horizontal edges touch a horizontal critical space. This occurs with the upper polygon marked 123 at the top of FIG. 4. Lemma 1 does not apply to the forms of FIG. 8 because all of the features touch critical spaces at top and bottom. Lemma 2 is a superset of Lemma 1 and applies to a connected group of polygons in both masks. Two polygons are connected if a boundary can be traced around them without including another polygon. All of the polygons in FIG. 8 are connected. Applying Lemma 2 to FIG. 8 allows the two masks to be simplified as shown in FIG. 9.

Figure 10:
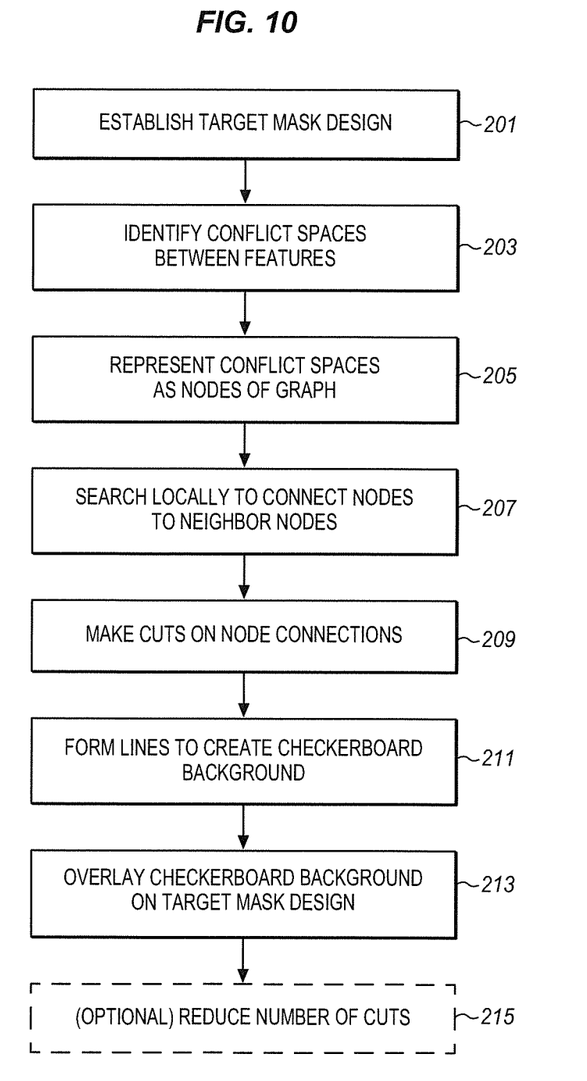
FIG. 10 is a process flow diagram of dividing features of a mask design according to an embodiment of the invention.

FIG. 10 is a process flow diagram for splitting a target photolithography mask design using principles as described above. Initially a target mask design is established at 201. This may be done in any of a variety of different ways. The target mask design is prepared for splitting into two double patterning masks as described below.

At 203, conflict spaces between the features of the target mask design are identified. The conflicts may arise in a many different ways. As described above, conflicts can be identified when the intended photolithography process is not able to accurately produce a particular feature due to the proximity of a neighboring feature. These constraints caused by the process may be predicted and then verified by experimentation or may be limitations that can be objectively deter mined based on dimensions or other physical process parameters.

At 205, the identified conflict spaces are represented as nodes on a graph. The medial axes of each node may then be shown as either horizontal or vertical for a typical phase shift mask, however, with other process technologies other types of nodes may be used depending on the configuration of the identified conflicts. At 207, local searches are performed on the nodes of the graph in order to find nearby nodes that can be connected together. These are shown as the arrows in the example of FIG. 3, above.

The nodes of the graph may then be connected to neighboring nodes based on the local search. The local search for a neighboring node may be limited by different process considerations. These may be manifested by length and angle. In other words, if a node is too far from the node from which the search starts, then it is no longer a neighboring node and no connection is made. Similarly, if a neighboring node requires a connection that is at an angle from the node from which the search starts, then the angle is compared to a maximum allowable angle. If the angle is too great, then the connection is not made. The search angles between nodes may be determined using process limitations, such as those on corner interactions and the local searches may be iterative.

At 209, the cuts can be made through the connections of the nodes on the graph. The cuts divide the features into those for the first of the two double patterning masks and those for the second of the two double patterning masks.

The cuts may be better selected using a min-cut algorithm and applying it to the identified nodes which represent the conflict spaces. In one example, the cuts are made by identifying. The identified conflict spaces, now represented as dashed lines on the checkerboard background are associated with connections between the nodes. The cut-lines are then determined by selecting cut-lines that cut through the connections between the nodes. A set of cut lines that cut through all of the connection would be best. However, some solution that does not cut every connection may also be used.

If all of the connections cannot be cut, then connections can be prioritized by attaching a weight or a cost to connection. The weight may be based on process limitations associated with the corresponding conflict space. The best set of cuts may then be the one that cuts through connections with the highest weights. Connections with no cost may be ignored and those with the highest cost are cut first.

At 211, the nodes of the graph, after they have been connected to other nodes are extended as lines to create a checkerboard background. For a typical horizontal and vertical grid of nodes and connections, the extensions will also be horizontal and vertical to make the checkerboard. At 213, the checkerboard background is overlaid on the target mask design. This allows the conflict spaces and the pattern created by the nodes, their connections, their extensions, and their cuts to be seen in relationship to the target mask design.

Overlaying allows the cuts to be applied directly to the features of the target mask design to split the features between masks. The features on one side of a cut are applied to one of the two double patterning masks and the features on the other side of a cut are applied to the other of the two double patterning masks. While the present description is in the context of double patterning and two masks, more masks may be used. As a result the cuts may result in features being split between three or more different masks.

The split of features on the target mask design between the two masks may then be improved at 215, depending on the particular implementation. A particularly useful improvement is to reduce the number of cuts after making the cuts on the target mask design at 213. The number of cuts may be reduced by considering the polygons after the cuts are made in comparison to the conflict spaces. A polygon may be viewed as a portion cut from a target mask design feature. If a polygon is in one mask and does not touch a critical space, then that polygon may be assigned to the other mask. This may be done to reduce the splitting of the features of the target mask design between the two masks.

The number of cuts may also be reduced by considering whether the cut line boundaries of a connected group of polygons touch a critical space. If the boundary does not touch a critical space then the cuts along the boundary may be removed.

After performing the checkerboard overlay and any optimizing operations, the features have been split between the two masks. The photolithography process may use the two masks to expose a photoresist layer in two exposure steps. The photoresist may be developed and removed to pattern a substrate in a process to eventually produce an electronic or micromechanical device.

Figure 11:
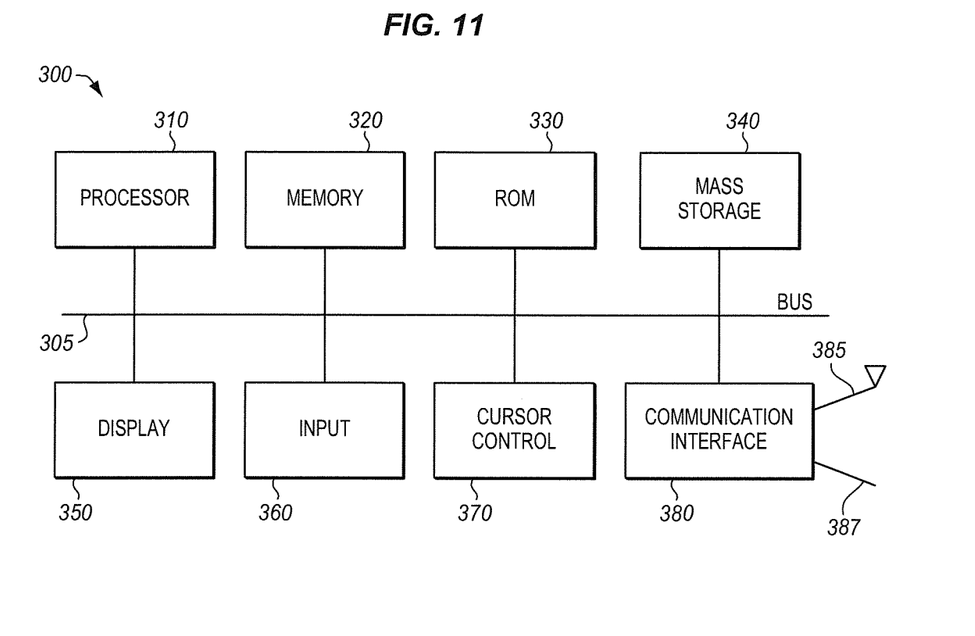
FIG. 11 is a block diagram of a computing system suitable for implementing embodiments of the invention.

FIG. 11 is a block diagram of one embodiment of computing node that may be used to implement the process flow of FIG. 10. Alternative systems may include more, fewer, or different components. Systems such as that illustrated may be coupled together to provide multiple computing nodes.

Electronic system 300 includes a bus 305 or other communications device to communicate information, and a processor 310 coupled to the bus 305 to process information. While the electronic system 300 is illustrated with a single processor, the electronic system 300 may include multiple processors or co-processors. The electronic system 300 further includes a random access memory (RAM) or other dynamic storage device 320 (referred to as memory), coupled to the bus 305 to store information and instructions to be executed by the processor 310. The memory 320 also may be used to store temporary variables or other intermediate information during execution of instructions by the processor 310.

The electronic system 300 also includes a read only memory (ROM) and/or other static storage device 330 coupled to bus 305 to store static information and instructions for the processor 310. A data storage device 340 is coupled to the bus 305 to store information and instructions.

The electronic system 300 may also be coupled via the bus 305 to a display device 350, such as a light emitting diode (LED) or liquid crystal display (LCD), to display information to a user. An input device 360, including alphanumeric and other keys, is typically coupled to the bus 305 to communicate information and command selections to the processor 310. Another type of user input device is a cursor control 370, such as a mouse, a trackball, or cursor direction keys to communicate direction information and command selections to the processor 310 and to control cursor movement on a display 350. The electronic system 300 further includes a network interface 380, such as a wired network interface 387 or a wireless network interface 385 to provide access to a network, such as a local area network.

Instructions are provided to memory from a storage device, such as magnetic disk, a read-only memory (ROM) integrated circuit, CD-ROM, DVD, via a remote connection (e.g., over a wired or wireless network via the network interface) providing access to one or more electronically-accessible media, etc. In alternative embodiments, hard-wired circuitry may be used in place of or in combination with software instructions. Thus, execution of sequences of instructions is not limited to any specific combination of hardware circuitry and software instructions.

A computer-readable medium includes any mechanism that provides (i.e., stores and/or transmits) content (e.g., computer executable instructions) in a form readable by an electronic device (e.g., a computer, a personal digital assistant, a cellular telephone). For example, a computer-readable medium may include read only memory (ROM), random access memory (RAM), magnetic disk storage media; optical storage media; or flash memory devices, etc.

Methods and apparatuses are described herein with respect to integrated circuit manufacturing; however, the techniques described may be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   identifying by a processor conflict spaces between features of a target photolithography mask design that is stored in a memory;
   representing the conflict spaces as nodes of a graph;
   searching locally between the nodes of the graph and inserting connections from nodes to neighboring nodes based on the local search;
   making cuts on the node connections to determine splitting mask assignments for double patterning the target mask design;
   extending the nodes and the connections to form lines on the graph that create a checkerboard background;
   overlaying, by the processor, the checkerboard background on the target mask design to apply the cuts to split the features of the target mask design into those for a first double patterning mask and those for a second double patterning mask.

2. The method of claim 1, wherein identifying conflict spaces comprising identifying conflict spaces using process constraints.

3. The method of claim 1, wherein searching comprises determining search angles between nodes using process limitations on corner interactions.

4. The method of claim 1, wherein extending the nodes and connections comprises forming lines in two orthogonal directions.

5. The method of claim 1, wherein the checkerboard background provides information about the identified critical spaces.

6. The method of claim 1, wherein making cuts comprises applying a mm-cut algorithm to the identified conflict spaces.

7. The method of claim 6, wherein the connections are associated with a weight based on process limitations associated with a corresponding conflict space and wherein determining cut lines comprises cutting through connections with the highest weights.

8. The method of claim 1 further comprising reducing the number of cuts after overlaying the checkerboard background on the target mask design.

9. The method of claim 8, wherein reducing the number of cuts comprises if a polygon, corresponding to a portion cut from a target mask design feature, is in one mask and does not touch a critical space, then assigning the polygon to the other mask.

10. The method of claim 8, wherein reducing the number of cuts comprises if a cut bounds a connected group of polygons, each polygon corresponding to a portion cut from a target mask design feature, and does not touch a conflict space, then removing the cut along the boundary.

11. The method of claim 1, wherein searching locally comprises searching using a minimum spanning forest algorithm.

12. The method of claim 1, wherein searching locally comprises using a set of heuristics.

13. A non-transitory computer-readable medium having instructions stored thereon that when executed by the computer cause the computer to perform operations comprising:
    identifying conflict spaces between features of a target photolithography mask design;
    representing the conflict spaces as nodes of a graph;
    searching locally between the nodes of the graph and inserting connections from nodes to neighboring nodes based on the local search;
    making cuts on the node connections to determine splitting mask assignments for double patterning the target mask design;
    extending the nodes and the connections to form lines on the graph that create a checkerboard background;
    overlaying the checkerboard background on the target mask design to apply the cuts to split the features of the target mask design into those for a first double patterning mask and those for a second double patterning mask.

14. The medium of claim 13, wherein extending the nodes and connections comprises forming lines in two orthogonal directions.

15. The medium of claim 13, wherein the connections are associated with a weight based on process limitations associated with a corresponding conflict space and wherein determining cut lines comprises cutting through connections with the highest weights.

16. The medium of claim 13, wherein searching locally comprises searching using a minimum spanning forest algorithm.

17. An apparatus comprising:
    a memory to store instructions and data values;

a communications interface to receive a target photolithography mask design; and a processor coupled to the memory and to the communication interface to perform operations including:

identifying conflict spaces between features of a target photolithography mask design;

representing the conflict spaces as nodes of a graph;

searching locally between the nodes of the graph and inserting connections from nodes to neighboring nodes based on the local search;

making cuts on the node connections to determine splitting mask assignments for double patterning the target mask design;

extending the nodes and the connections to form lines on the graph that create a checkerboard background;

overlaying the checkerboard background on the target mask design to apply the cuts to split the features of the target mask design into those for a first double patterning mask and those for a second double patterning mask.

18. The apparatus of claim 17, wherein searching comprises determining search angles between nodes using process limitations on corner interactions.

19. The apparatus of claim 17, wherein the checkerboard background provides information about the identified critical spaces.

* * * * *